(12) United States Patent
Fang et al.

(10) Patent No.: US 12,494,448 B2
(45) Date of Patent: Dec. 9, 2025

(54) UBM-FREE METAL SKELETON FRAME WITH SUPPORT STUDS AND METHOD FOR FABRICATION THEREOF

(71) Applicant: NXP B.V., Eindhoven (NL)

(72) Inventors: Che Ming Fang, Kaohsiung (TW); Kuan-Hsiang Mao, Kaohsiung (TW); Yufu Liu, Taoyuan (TW); Wen Hung Huang, Kaohsiung (TW)

(73) Assignee: NXP B.V., Eindhoven (NL)

( * ) Notice: Subject to any disclaimer, the term of this patent is extended or adjusted under 35 U.S.C. 154(b) by 544 days.

(21) Appl. No.: 17/867,853

(22) Filed: Jul. 19, 2022

(65) Prior Publication Data
US 2024/0030173 A1    Jan. 25, 2024

(51) Int. Cl.
    *H01L 23/00* (2006.01)
(52) U.S. Cl.
    CPC .............. *H01L 24/20* (2013.01); *H01L 24/11* (2013.01); *H01L 24/13* (2013.01); *H01L 24/19* (2013.01); *H01L 24/73* (2013.01); *H01L 2224/11849* (2013.01); *H01L 2224/13027* (2013.01); *H01L 2224/2101* (2013.01); *H01L 2224/2105* (2013.01); *H01L 2224/211* (2013.01); *H01L 2224/214* (2013.01); *H01L 2224/73101* (2013.01)

(58) Field of Classification Search
    CPC ......... H01L 24/20; H01L 24/11; H01L 24/19; H01L 24/13; H01L 24/73
    See application file for complete search history.

(56) References Cited

U.S. PATENT DOCUMENTS

| | | | |
|---|---|---|---|
| 6,018,249 A * | 1/2000 | Akram | G01R 1/04 |
| | | | 324/750.25 |
| 7,977,789 B2 | 7/2011 | Park | |
| 2007/0178622 A1* | 8/2007 | Liu | H01L 23/5389 |
| | | | 257/E23.102 |
| 2015/0228594 A1 | 8/2015 | Alvarado et al. | |
| 2022/0231660 A1* | 7/2022 | Dutta | H03H 9/02582 |

* cited by examiner

*Primary Examiner* — Mohammad M Choudhry (57) ABSTRACT

An IC package includes one or more microelectronic devices, a plurality of package bumps disposed at a first side, and a metal structure electrically connecting at least a first device contact pad of a first microelectronic device and at least a first package bump of the plurality of package bumps. The metal structure includes an RDL trace extending between a first region aligned with the first device contact pad and a second region aligned with the first package bump, wherein the first package bump is mechanically and electrically connected directly to the second region of the RDL trace. The metal structure further includes a first via extending between the first region of the RDL trace and the first device contact pad and further includes a set of one or more support studs extending from the second region to a support surface facing the first side.

20 Claims, 11 Drawing Sheets

UBM-FREE METAL SKELETON FRAME WITH SUPPORT STUDS AND METHOD FOR FABRICATION THEREOF

BACKGROUND

Substrate-less integrated circuit (IC) packages employ one or more integrated circuit (IC) die, surface mount IC devices (SMDs) or other microelectronic devices embedded in molding (or encapsulant) with one or more redistribution layers (RDLs) at a front side of the package to provide electrical routes between the contact pads of the microelectronic device(s) and the solder balls or other bumping structures of the package. Conventionally, an under-bump metallization (UBM) structure is formed over, and in electrical contact, a corresponding RDL, which in turn is electrically and mechanically connected to one or more contact pads of one or more microelectronic devices. While the UBM structure can provide certain benefits, including serving to mitigate unwanted diffusion while providing a more robust mechanical and electrical connection between the bump and the corresponding RDL (or the device contact pad itself if the bump is aligned with the device contact pad), forming the UBM structure requires one or more separate fabrication steps, which results in increased device fabrication time, effort, and cost.

SUMMARY OF EMBODIMENTS

In accordance with one aspect, an integrated circuit (IC) package includes one or more microelectronic devices disposed between a first side and an opposing second side of the IC package, a plurality of package bumps disposed at the first side of the IC package, and a metal structure electrically connecting at least a first device contact pad of a first microelectronic device and at least a first package bump of the plurality of package bumps. The metal structure includes a redistribution layer (RDL) trace extending parallel to the first side between a first region and a second region, the first region aligned with the first device contact pad and the second region aligned with the first package bump, wherein the first package bump is mechanically and electrically connected directly to the second region of the RDL trace. The metal structure further includes a first via extending between, and electrically coupled to, the first region of the RDL trace and the first device contact pad and a set of one or more support studs extending from the second region of the RDL trace to a support surface parallel to a surface of the first microelectronic device facing the first side.

In various implementations, the IC package further can include one or more of the following aspects, individually or in combination; the IC package further includes at least one repassivation layer encapsulating the metal structure, wherein the at least one repassivation layer encapsulates a portion of the first package bump adjacent to the second region of the RDL trace; the RDL trace comprises an under-bump cavity in which the first package bump is at least partially disposed; the IC package further comprising a seed layer electrically and mechanically connecting the first via to the first device contact pad; the first region of the RDL trace is further aligned with a second device contact pad of the first microelectronic device and includes a second via extending between, and electrically coupled to, the first region of RDL trace and the second device contact pad and wherein the second region of the RDL trace is further aligned with a second package bump and wherein the second package bump is mechanically and electrically connected directly to the second region of the RDL trace; the second region of the RDL trace is further aligned with a second package bump and wherein the second package bump is mechanically and electrically connected directly to the second region of the RDL trace; the supporting surface is one of the surface of the first microelectronic device, a surface of a second microelectronic device adjacent to the first microelectronic device, or a surface of a layer of dielectric material formed adjacent to the first microelectronic device; the first package bump is one of a solder bump or a metal pillar and the first microelectronic device is one of an integrated circuit die or a surface mount IC device.

In accordance with another aspect, a method of fabrication of an integrated circuit (IC) package, includes forming a workpiece comprising one or more microelectronic devices and forming a metal structure electrically connected to a first device contact pad of a first microelectronic device. The metal structure includes a redistribution layer (RDL) trace extending parallel to a facing surface of the first microelectronic device between a first region and a second region, the first region aligned with the first device contact pad, a first via extending between, and electrically coupled to, the first region of the RDL trace and the first device contact pad, and a set of one or more support studs extending from the second region of the RDL trace to a support surface parallel to the facing surface of the first microelectronic device. The method further includes disposing a first package bump at the second region, the first package bump electrically and mechanically connected directly to the RDL trace in the second region and encapsulating the metal structure in one or more repassivation layers.

The method further may include one or more of the following aspects, individually or in combination: the first package bump is disposed at the second region after encapsulating the metal structure; forming the metal structure comprises forming a stack of patterned photo-resist layers on the workpiece, the stack of patterned photo-resist layers forming a mask for forming the metal structure, performing an electroplating process using the mask to form the metal structure, stripping the stack of patterned photo-resist layers from the workpiece; the method further includes, after performing the electroplating process and prior to stripping the stack of patterned photo-resist layers, forming and patterning an additional photo-resist layer to provide an aperture through the additional photo-resist layer to expose a surface of the second region of the RDL trace and performing an etching process using the additional photo-resist layer to etch an under-bump cavity at the surface of the second region of the RDL trace through the aperture, wherein disposing the first package bump at the second region comprises disposing the first package bump at the under-bump cavity of the second region and wherein encapsulating the metal structure in one or more repassivation layers includes encapsulating a portion of the first package bump adjacent to the second region in the one or more repassivation layers; the method further includes after performing the electroplating process and prior to stripping the stack of patterned photo-resist layers, forming and patterning an additional photo-resist layer to provide an aperture through the additional photo-resist layer to expose a surface of the second region of the RDL trace, wherein disposing the first package bump at the second region comprises disposing the first package bump in the aperture at the surface of the second region of the RDL trace, and wherein encapsulating the metal structure in one or more repassivation layers includes encapsulating a portion of the first package bump adjacent to the second region in the one or more repassivation layers; the method further includes forming an aperture through the one or more repassivation layers to expose a surface of the second region of the RDL trace and disposing the first package bump in the aperture at the surface of the second region of the RDL trace; the method further includes forming a seed layer overlying the first device contact pad on the facing surface of the first microelectronic device and wherein forming the stack of patterned photo-resist layers on the workpiece comprises: forming a first photo-resist layer on the workpiece and patterning the first photo-resist layer to form a first patterned photo-resist layer that includes a first aperture exposing the seed layer and one or more second apertures exposing the supporting surface and forming a second photo-resist layer on the first patterned photo-resist layer and patterning the second photo-resist layer to define side surfaces of the RDL trace; forming the metal structure comprises forming the metal structure so that the first region of the RDL trace is further aligned with a second device contact pad of the first microelectronic device and includes a second via extending between, and electrically coupled to, the first region of RDL trace and the second device contact pad and wherein forming the metal structure comprises forming the metal structure so that the second region of the RDL trace is further aligned with a second package bump and wherein the second package bump is mechanically and electrically connected directly to the second region of the RDL trace; and forming the metal structure comprises forming the metal structure so that the second region of the RDL trace is further aligned with a second package bump and wherein the second package bump is mechanically and electrically connected directly to the second region of the RDL trace.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

FIGS. 1-11 illustrate embodiments of an integrated circuit (IC) package employing a UBM-free stud-supported metal skeleton structure for package bumping. As with conventional substrate-less/fan-out IC packages, embodiments of the IC package described herein implement one or more microelectronic devices, such as surface mount IC devices (SMDs) or IC die, and one or more RDLs to provide electrical routing between the contact pads (e.g., die pads) of the microelectronic devices and the package bumps formed at the front surface of the IC package. However, in at least one embodiment, the implementations of the IC package described herein utilize a UBM-free skeleton structure that laterally extends from one or more die pads or other contact pads of one or more microelectronic devices to one or more package bumps and which uses one or more metal studs to provide mechanical support to the region of the skeleton structure under the one or more package bumps. These metal studs, like vias, comprise "vertical" metal structures that extend between layers, but rather than being formed to provide for electrical connections, these metal studs instead are utilized to provide physical support for the skeleton structure, particularly during a fabrication process in which the photo-resist material underlying the metal skeleton structure is stripped and thus leaving the metal skeleton structure standing above the underlying surface(s). For this reason, these metal studs are referred to herein as "support studs." Further, embodiments of a fabrication process for fabricating the IC package are described. This fabrication process, in at least one embodiment, includes a first stage in which the metal skeleton structure is formed first via one or more photo-resist etch and sputter processes, and then the bumping process is completed with a second stage that can utilize one sputter process, one plating process, one photo-resist process, one seed-layer etching process, and one-step repassivation. As the metal skeleton structure is formed first in these embodiments, the resulting structure is also referred to herein as a "metallization-first" skeleton structure.

In this approach, an IC package can implement package bumping using a package bump-to-device contact pad conductive pathway utilizing an RDL trace and supporting studs in a metallization-first process that eliminates the need for formation of a UBM structure and utilizes one-step sputtering, electroplating, photo-resist stripping, etching, and re-passivation, and thus reduces cost and fabrication time to bumping processes that rely on UBM structures. Moreover, the structures and processes described herein are readily implemented in any of a variety of package assembly processes that rely on package bumping, including wafer level packaging (WLP) and panel level packaging (PLP) processes.

Note that in the following, certain positional terms, such as top, bottom, front, back, side, and the like, are used in a relative sense to describe the positional relationship of various components. These terms are used with reference to the relative position of components either as shown in the corresponding figure or as used by convention in the art and are not intended to be interpreted in an absolute sense with reference to a field of gravity. Thus, for example, a surface shown in the drawing and referred to as a top surface of a component would still be properly understood as being the top surface of the component, even if, in implementation, the component was placed in an inverted position with respect to the position shown in the corresponding figure and described in this disclosure. Moreover, it will be appreciated that for simplicity and clarity of illustration, components shown in the figures have not necessarily been drawn to scale. For example, the dimensions of some of the components may be exaggerated relative to other components. It further will be appreciated that although certain actions are described in a particular order for ease of description, certain actions may be performed in a different order than that described or omitted entirely, unless described otherwise herein.

It also should be noted that the term "metal" as used herein shall be understood to refer to an elemental metal (e.g., copper (Cu) or nickel (Ni)), a metal alloy (e.g., a copper-nickel alloy), a combination of metals, a combination of metal alloys, or a combination of one or more metals and one or more metal alloys (e.g., a copper layer with a copper-nickel-palladium plating).

Figure 1:
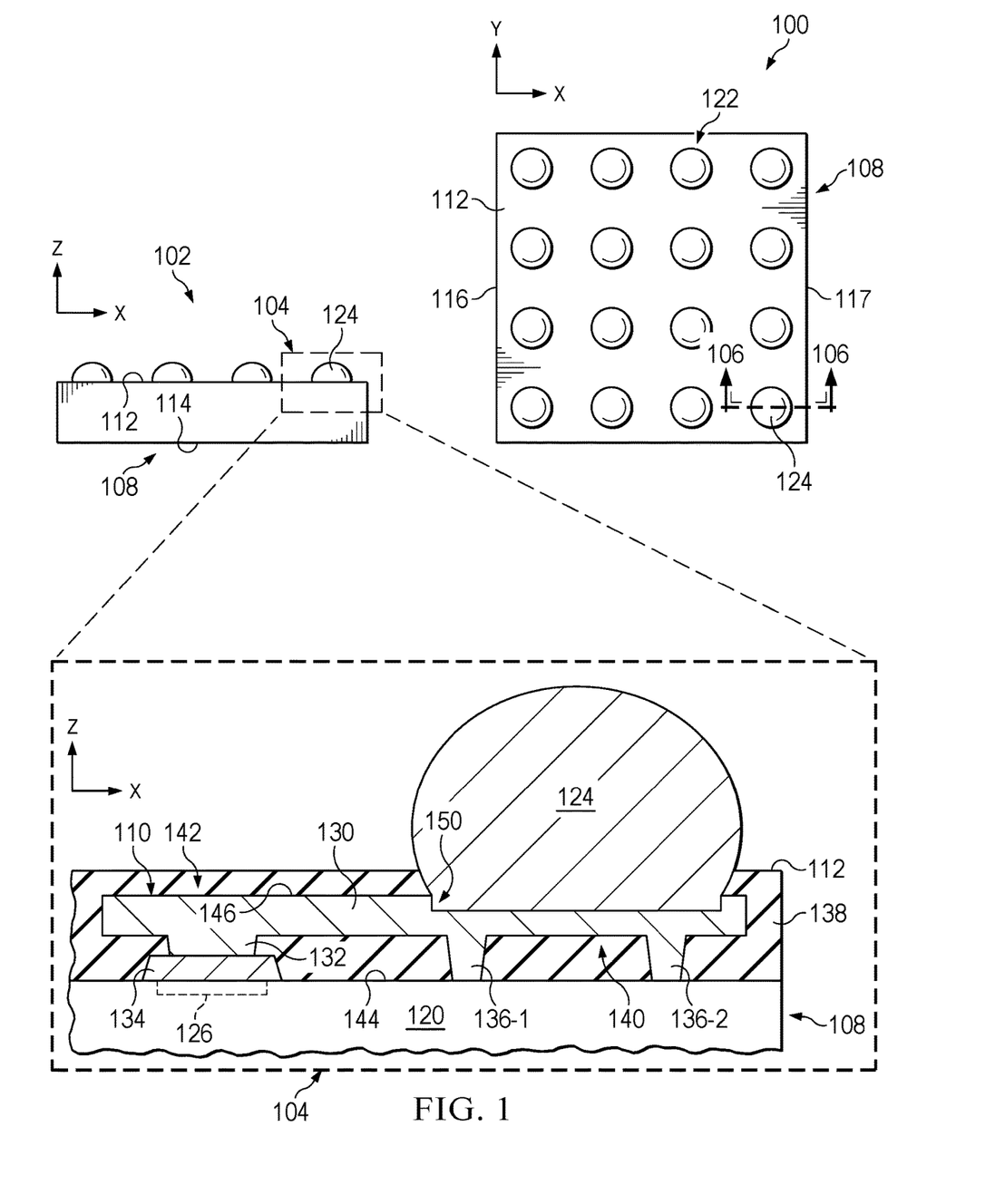
FIG. 1 is a bottom view, side view, and partial cross-section view of an IC package utilizing a stud-supported metallization-first metal skeleton structure for package bumping in accordance with some embodiments.

FIG. 1 illustrates a plan view 100, side view 102, and partial cross-section view 104 (in the X-Z plane) along cut-line 106 of an integrated circuit (IC) package 108 employing a metal skeleton structure 110 for package bumping in accordance with some embodiments. The IC package 108 has a first side 112 and an opposing back side 114 (referred to herein as "front side 112" and "back side 114" for ease of reference), as well as four sidewalls, including opposing sidewalls 116 and 117. Embedded in the IC package 108 between the front side 112 and the back side 114 is one or more microelectronic devices 120. Although only a single microelectronic device 120 is depicted, it will be appreciated that more than one microelectronic device 120 may be positioned side-by-side in the IC package 108. The microelectronic device(s) 120 can include one or more SMDs, one or more IC die, or a combination thereof.

The front side 112 serves as the mounting surface for mounting the IC package 108 to a substrate or another component of an electronic device, and thus includes an array 122 of package bumps, such as package bump 124, disposed at the front side 112. The package bumps can include any of a variety of types of package bumps, such as, for example, ball grid array (BGA) bumps, metal pillars, metal posts, and the like. For purposes of illustration, an implementation of the package bumps as solder balls is utilized throughout the following description, although other suitable package bump types, such as metal pillars, may be employed in a similar manner using the guidelines provided herein. Although a regular 4×4 array 122 is illustrated, it will be appreciated that the array 122 may comprise any number of package bumps, and may be an irregular array, an array of package bumps primarily at the perimeter or an array of package bumps that substantially span the front side 112, and the like.

In at least one embodiment, the IC package 108 is a substrate-less IC package and thus utilizes a set of one or more redistribution layers (RDLs) disposed between the microelectronic device(s) 120 and the front side 112 and which provide fan-out contact pad routing between device contact pads (e.g., device contact pad 126) of the one or more microelectronic devices 120 and the array 122 of package bumps at the front side 112 of the IC package 108. Each RDL is a layer of one or more wiring interconnects and typically includes a repassivation layer or other dielectric layer in which one or more vias, traces, bars, or other conductive structures are formed to provide corresponding portions of conductive paths between die pads or other contact pads of the one or more microelectronic devices 120 and the package bumps 124. For ease of illustration, the IC package 108 is illustrated with a single RDL. However, the IC package 108 may include a stack of multiple RDLs, with the number of stacked RDLs depending on the degree of fan out, the number of microelectronic device contact pads, the number of package bumps, etc.

To facilitate electrical connection between one or more of the package bumps 124 and one or more device contact pads 126, the IC package 108 employs the metal skeleton structure 110 extending "horizontally" (that is, substantially parallel to the X-Y plane) and "vertically" (that is, substantially parallel to the Z axis) between the one or more package bumps 124 and the one or more device contact pads 126. In the illustrated embodiment, the metal skeleton structure 110 includes an RDL trace 130, a via 132 and a seed layer 134 for each device contact pad 126 connected to the metal skeleton structure 110, and one or more support studs 136, such as the two support studs 136-1 and 136-2 illustrated in the partial cross-section view 104, all of which are encapsulated by, or embedded in, at least one repassivation layer 138. Although referenced herein as distinct components for ease of description, as explained below, the RDL trace 130, the via 132, and the one or more support studs 136 of the metal skeleton structure 110 can be formed from the same metallization process (e.g., an electroplating process) and result in a continuous, or monolithic, metal structure having these components as features.

The RDL trace 130 extends from at least one bump capture region 140 underlying one or more package bumps 124 to at least one device contact region 142 overlying one or more device contact pads 126 and is composed of a metal used for the RDL of the IC package 108, such as copper (Cu) or a copper alloy. The seed layer 134 is formed via, for example, sputtering or physical vapor deposition (PVD), and is composed of a metal, such as copper or copper alloy, to facilitate electrical and physical coupling between the underlying device contact pad 126 and the overlying via 132. The via 132 extends "vertically" between the seed layer 134 and the RDL trace 130 so as to form a mechanical and electrical connection between the RDL trace 130 and the seed layer 134 and is likewise composed of one or more metals, such as copper or a copper alloy.

The one or more support studs 136 operate to provide structural support for the RDL trace 130 and the overlying one or more package bumps 124, and thus extend from the RDL trace 130 to an underlying support surface 144 facing the RDL trace 130 in, or proximate to, the bump capture region 140. In the illustrated example, the underlying support surface 144 is the facing surface of the microelectronic device 120, but as described below with reference to FIGS. 4 and 5, the support surface 144 instead can be a facing surface of a second microelectronic device 120, a facing surface of a layer of encapsulant, molding or fan-out compound, or a facing surface of another embedded component of the IC package 108. As with the RDL trace 130, the one or more support studs 136 are composed of a metal, such as copper or a copper alloy. Although illustrated as substantially columnar, the support studs 136 can employ any of a variety of shapes, including rectangular pillars, pyramids, and the like. The number and pitch of support studs 136 implemented in the metal skeleton structure 110, and the lateral dimensions of the support studs 136, may depend on a number of factors, such as the dimensions of the RDL trace 130 and, in particular, of the bump capture region 140, the number of package bumps 124 being supported, the distance between the RDL trace 130 and the support surface 144, the filling capability of the repassivation layer 138, and the like. Unlike the via 132, which operates to provide both an electrical connection and a mechanical connection between the RDL trace 130 and the underlying seed layer 134 (and thus the device contact pad 126), in at least one embodiment some or all of the support studs 136 do not operate to provide electrical conductivity, but instead primarily mechanical support, and in particular, mechanical support for the RDL trace 130 during the fabrication process in which the photo-resist material used as a mask to form the metal skeleton structure 110 is stripped, temporarily leaving the metal skeleton trace 110 with only the support of its via(s) 132 and support studs 136 before a repassivation process once again encapsulates the metal skeleton structure 110.

Unlike conventional package bumping approaches whereby a UBM structure is formed under a package bump, in at least one embodiment the metal skeleton structure 110 does not utilize a UBM structure to facilitate connection and containment of a corresponding package bump 124. Rather, in at least one embodiment, the package bump 124 is mechanically and electrically connected directly to a top surface 146 of the RDL trace 130 (that is, without an intervening UBM structure), and containment of the solder or other material of the package bump 124 during reflow is achieved either via an aligned aperture in the one or more repassivation layers 118 or via an aligned aperture formed in a temporary overlying photo-resist layer that is removed during the fabrication process, as described in detail below. Further, in some embodiments, the RDL trace 130 includes an under-bump cavity 150 formed in the RDL trace 130 at the top surface 146 and aligned with the intended position of the corresponding package bump 124 so as to facilitate placement, containment, and direct mechanical and electrical connectivity of the solder or other material of the package bump 124 during the bumping process. In other embodiments, an under-bump cavity is omitted (as illustrated by, for example, the implementations of FIGS. 6 and 7).

As described in greater detail below with reference to FIGS. 8-11, the omission of a UBM structure such that the package bump 124 is directly mounted on the RDL trace 130 of the metal skeleton structure 110 (that is, without the use of an intervening UBM structure) and the use of the one or more support studs 136 facilitate a bumping fabrication process in which the metal skeleton structure 110 may be formed first via a metallization stage and in which underlying temporary support layers are stripped or otherwise removed at an intermediate stage of the fabrication process such that the metal skeleton structure 110 overlies the support surface 144 (and the top surface of the microelectronic device 120 in instances when they are separate surfaces) without any intervening support layer or material. The package bump 124 and one or more repassivation layers 118 are formed thereafter. Thus, the IC package 108 may be fabricated such that the metallization of the package bumping infrastructure is formed first, followed by bump formation and repassivation. This metallization-first approach can facilitate the elimination of multiple instances of various fabrication processes, and thus can result in a single step for each of sputtering, electroplating, photo-resist strip, and etching processes.

Figure 2:
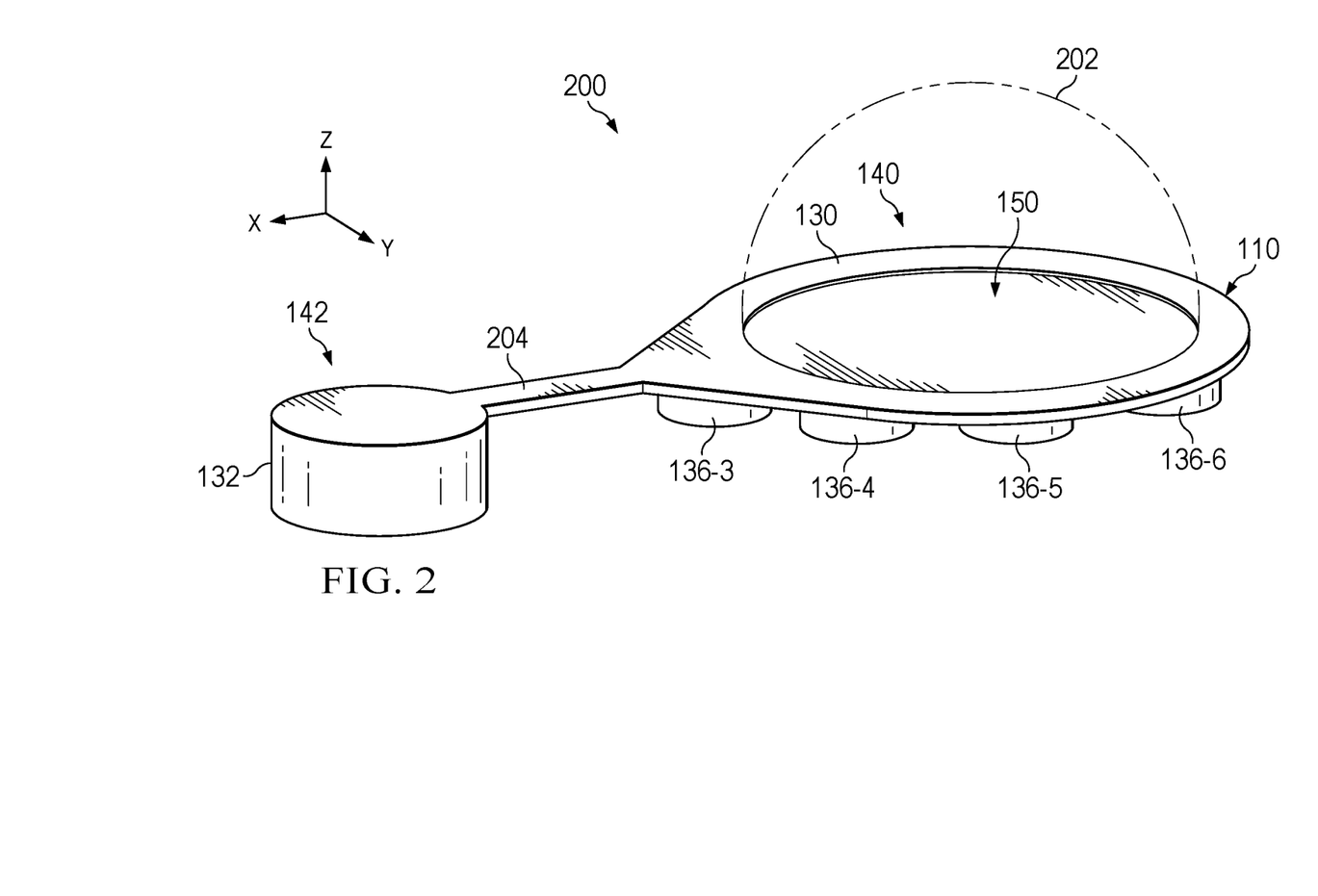
FIG. 2 is an expanded perspective view of an implementation of the metal skeleton structure of the IC package of FIG. 1 for connection to a single device contact pad in accordance with some embodiments.

FIG. 2 illustrates a perspective view 200 of one implementation of the UBM-free metal skeleton structure 110 in accordance with some embodiments. In this implementation, the bump capture region 140 of the RDL trace 130 is configured to connect to a single package bump 124 (formed from, for example, reflow of the illustrated solder ball 202) and thus includes a single under-bump cavity 150 formed therein. The metal skeleton structure 110 includes an array of support studs 136 underlying the bump capture region 140, including the illustrated support studs 136-3, 136-4, 136-5, and 136-6. Likewise in this example, the device contact region 142 is configured to connect to a single device contact pad 126, and thus is configured to provide mechanical and electrical coupling to a single underlying via 132. A single bar section 204 of the RDL trace 130 electrically connects the bump capture region 140 and the device contact region 142.

Figure 3:
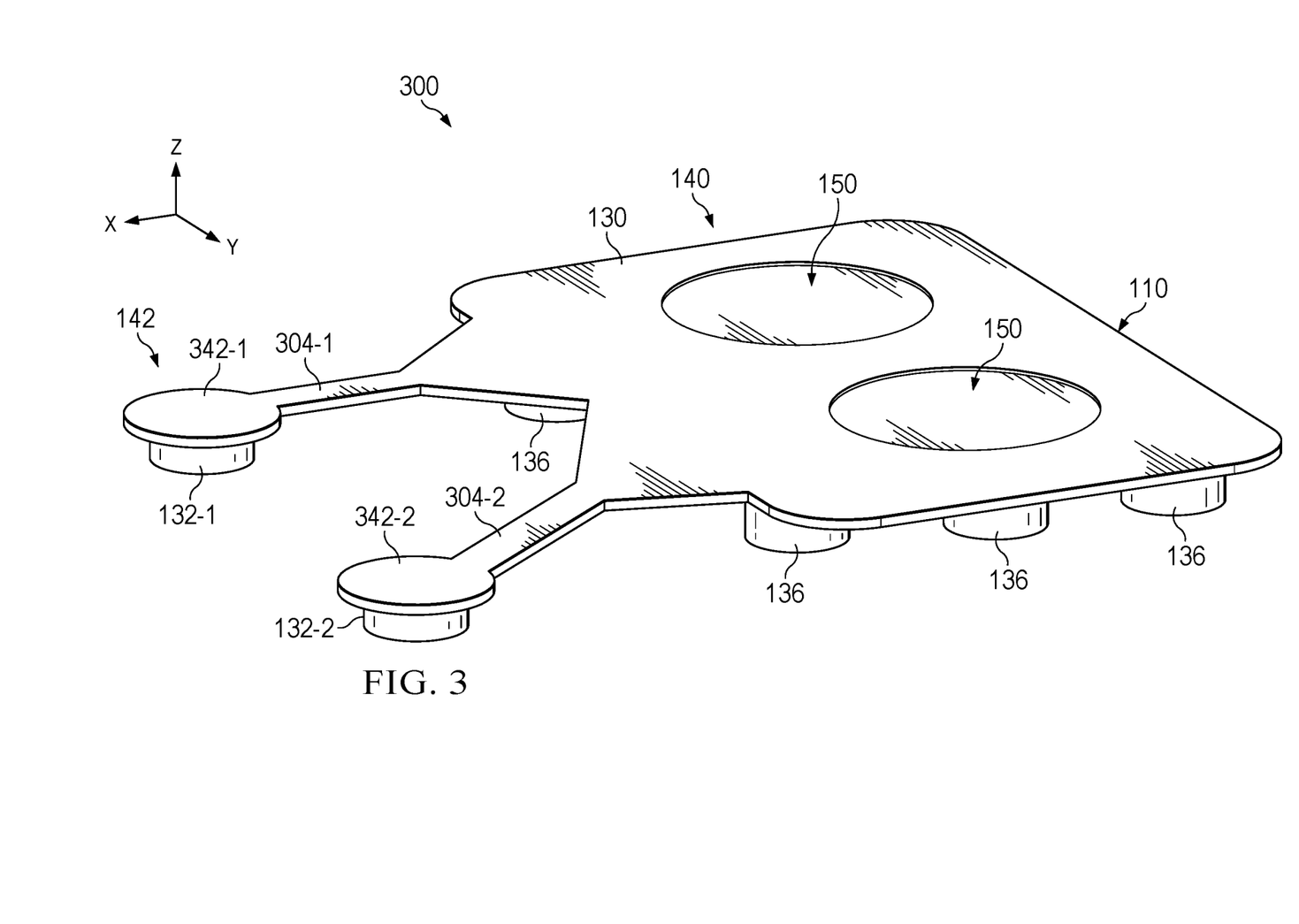
FIG. 3 is an expanded perspective view of an implementation of the metal skeleton structure of the IC package of FIG. 1 for connection to multiple device contact pads in accordance with some embodiments.

FIG. 3 illustrates a perspective view 300 of another implementation of the UBM-free metal skeleton structure 110 in accordance with some embodiments. In this example, the metal skeleton structure 110 provides interconnection between multiple package bumps 124 and multiple device contact pads 126 to facilitate a higher current, such as for the transmission of a supply voltage or ground distribution. Thus, in this implementation the bump capture region 140 of the RDL trace 130 is configured to connect to two package bumps 124 and thus includes two under-bump cavities 150 formed therein. An array of support studs 136 underlies the bump capture region 140. The illustrated device contact region 142 is configured to connect to two device contact pads 126, and thus includes two subregions 342-1 and 342-2, each configured to provide mechanical and electrical coupling to an underlying via 132 (via 132-1 and via 131-2, respectively). Bar sections 304-1 and 304-2 of the RDL trace 130 electrically connect the bump capture region 140 to the device contact subregions 342-1 and 342-2, respectively.

While FIGS. 2 and 3 illustrate a 1:1 configuration and a 2:2 configuration, respectively, for package bump to device contact pads connections provided by the metal skeleton structure 110, other ratios may be implemented. For example, the metal skeleton structure 110 could provide an electrical pathway between a single package bump 124 and multiple device contact pads 126, an electrical pathway between multiple package bumps 124 and a single device contact pad 126, or more generally, between N package bumps 124 and M device contact pads 126, where N and M are greater than or equal to 1 and can be the same or different numbers.

Moreover, while FIG. 1 illustrates implementation of the metal skeleton structure 110 in an IC package 108 in which the support surface 144 upon which the support studs 136 rest is the "top" surface of the same microelectronic device 120 to which the metal skeleton structure electrically connects, in other embodiments the support surface 144 may be the facing surface of another component of the IC package.

Figure 4:
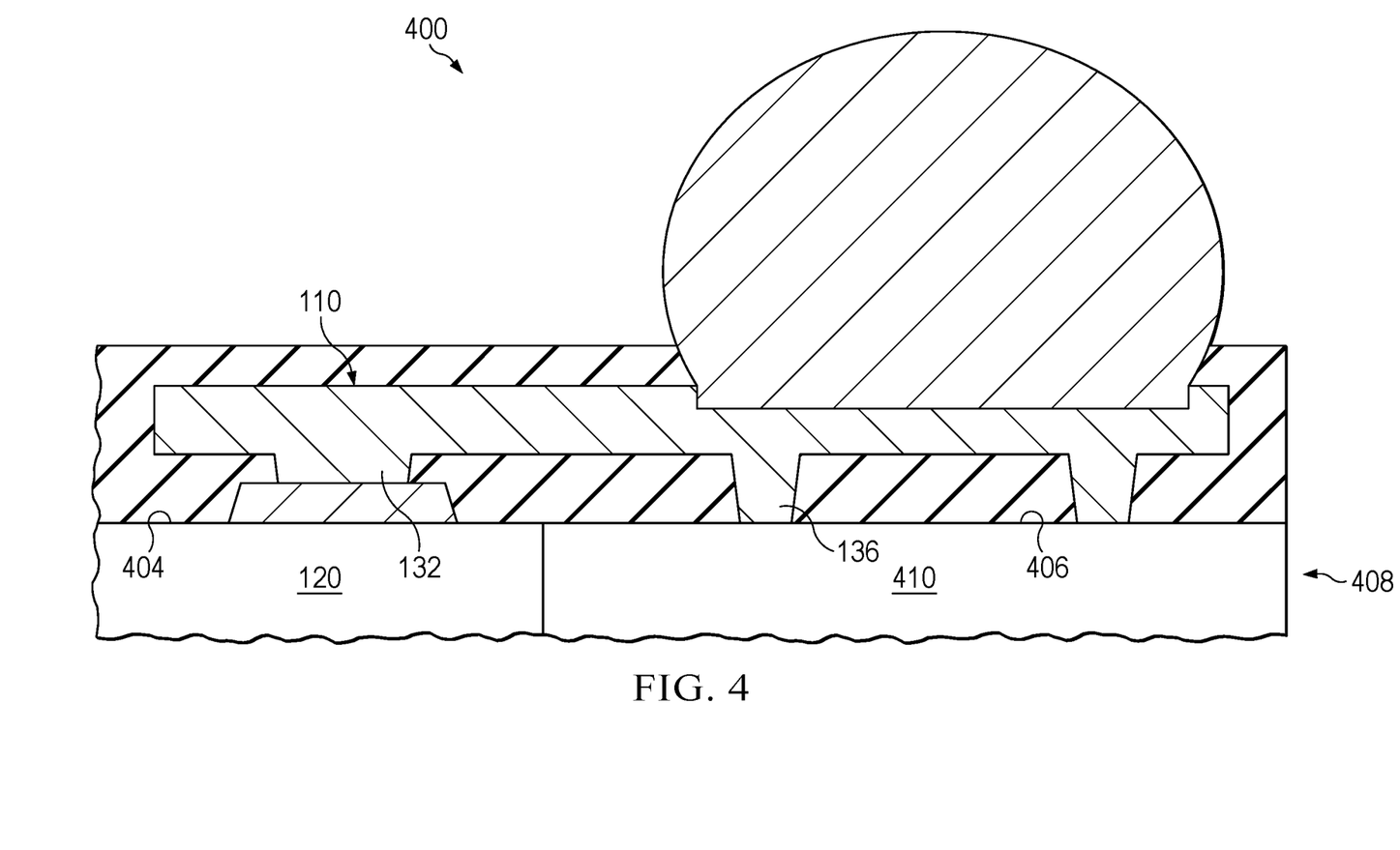
FIG. 4 is a partial cross-section view of an IC package utilizing a metallization-first metal skeleton structure laterally extending over a packaging compound and using support studs supported by a facing surface of the packaging compound in accordance with some embodiments.

For example, FIG. 4 illustrates a partial cross-section view 400 of an IC package 408 (one embodiment of the IC package 108) in which the lateral extent of the microelectronic device 120 terminates between the via 132 and the support studs 136 of the metal skeleton structure 110, and thus rather than the facing surface (surface 404) of the microelectronic device 120 serving as the support surface 144 for the support studs 136, the support surface 144 is implemented as the top surface 406 of a layer 410 adjacent to, and substantially level with, the microelectronic device 120. This layer 410 may be formed of, for example, a layer of encapsulant (e.g., molding compound or fan-out compound) used to partially encapsulate the microelectronic device 120.

Figure 5:
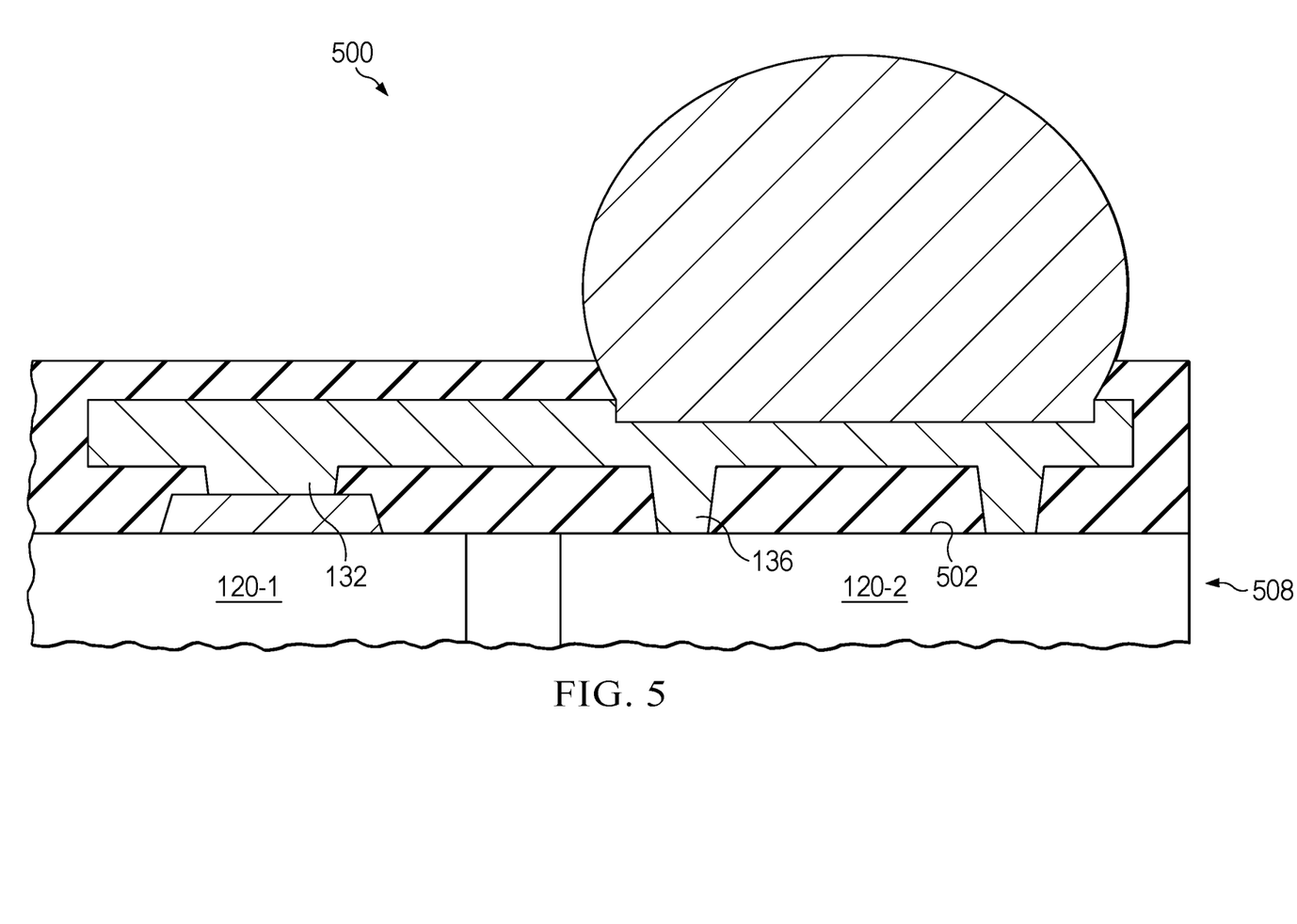
FIG. 5 is a partial cross-section view of an IC package utilizing a metallization-first metal skeleton structure laterally extending between adjacent die in accordance with some embodiments.

As another example, FIG. 5 illustrates a partial cross-section view 500 of an IC package 508 (one embodiment of the IC package 108) having multiple microelectronic devices 120 laterally arranged withing the IC package 508 and in which the via 132 connects to a device contact pad 126 of a first microelectronic device 120-1, while the top surface 502 of a second microelectronic device 120-2 serves as the support surface 144 for the support studs 136 of the metal skeleton structure 110.

Figure 6:
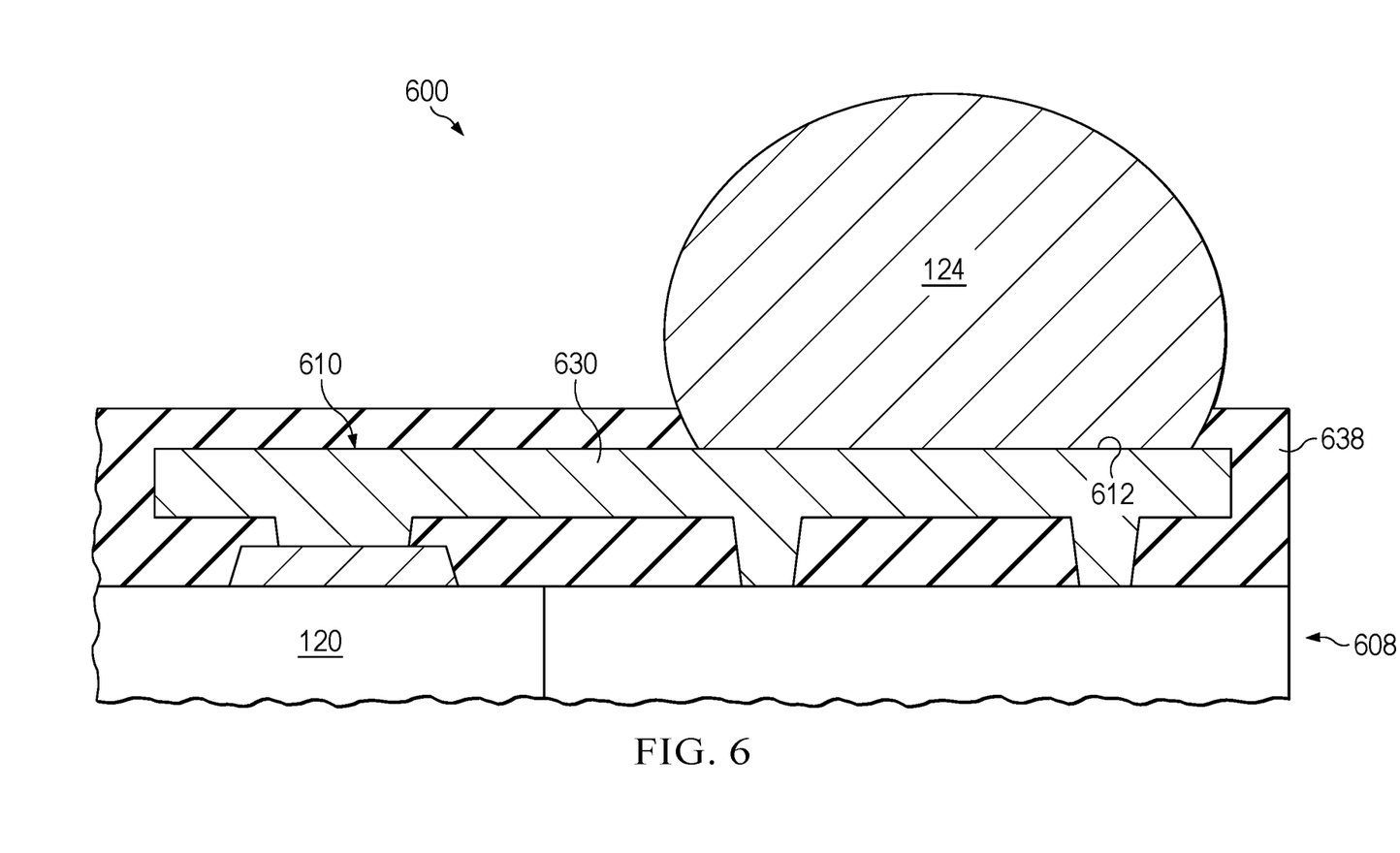
FIG. 6 is a partial cross-section view of an IC package utilizing a metallization-first metal skeleton structure without an under-bump cavity in accordance with some embodiments.
Figure 7:
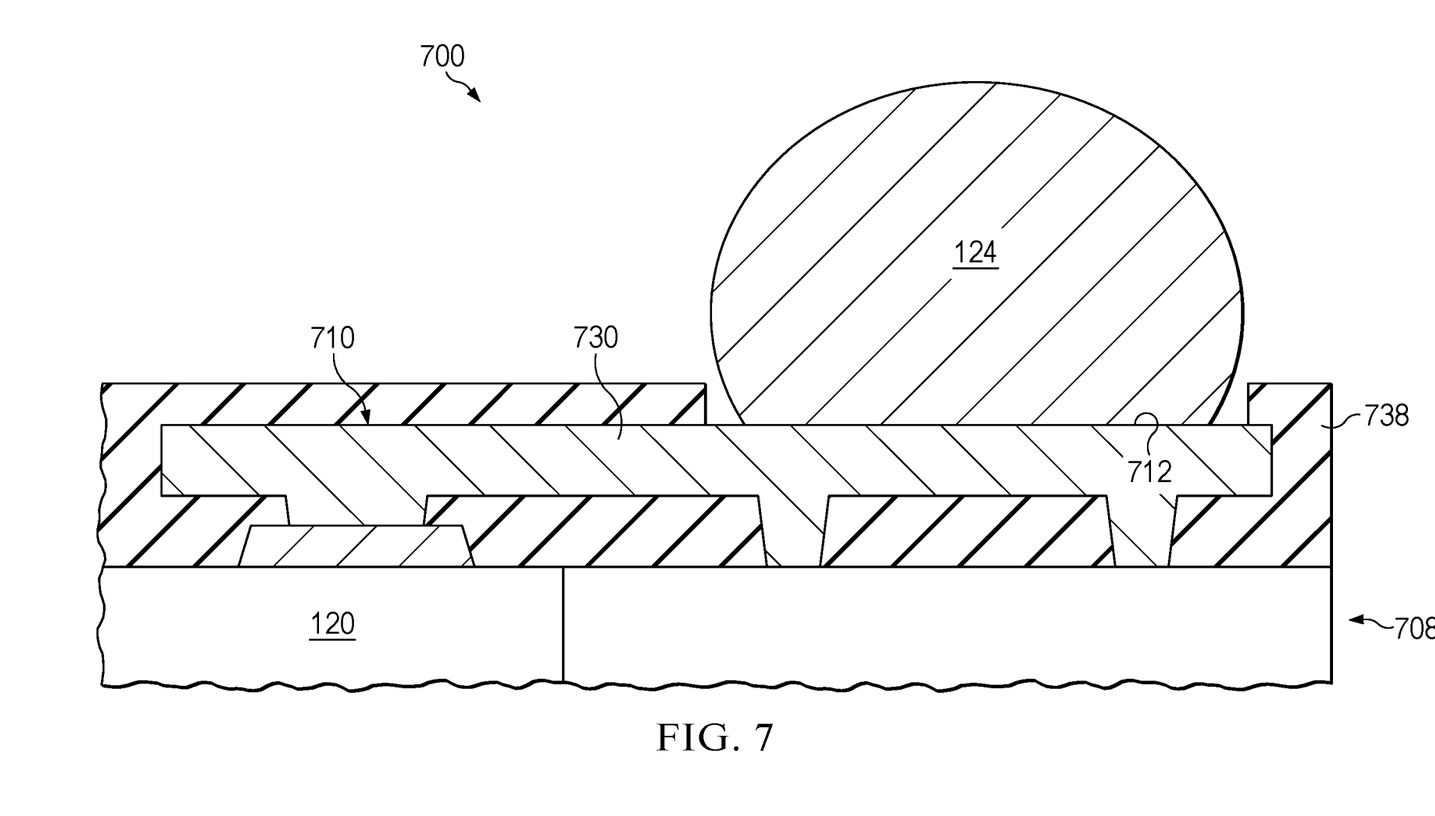
FIG. 7 is a partial cross-section view of another IC package utilizing a metallization-first skeleton structure without an under-bump cavity in accordance with some embodiments.

Moreover, while FIG. 1 illustrates implementation of the metal skeleton structure 110 in an IC package 108 in which the metal skeleton structure 110 incorporates an under-bump cavity 150 to partially capture/contain a corresponding package bump 124 formed thereon, in other embodiments the metal skeleton structure may omit use of an under-bump cavity for a corresponding package bump 124. To illustrate, FIG. 6 illustrates a partial cross-section view 600 of an IC package 608 (one embodiment of the IC package 108) having a metal skeleton structure 610 (one embodiment of the metal skeleton structure 110) laterally and vertically extending between a microelectronic device 120 and a package bump 124, with the package bump 124 mounted on a top surface 612 of a RDL trace 630 of the metal skeleton structure 610 without the use of an under-bump cavity. Likewise, FIG. 7 illustrates a partial cross-section view 700 of an IC package 708 (one embodiment of the IC package 108) having a metal skeleton structure 710 (one embodiment of the metal skeleton structure 110) laterally and vertically extending between a microelectronic device 120 and a package bump 124, with the package bump 124 mounted on a top surface 712 of a RDL trace 730 of the metal skeleton structure 710 without the use of an under-bump cavity. As described in detail below with reference to FIGS. 10 and 11, the IC package 608 and IC package 708 differ in that for the IC package 608, the package bump 124 is formed prior to formation of the repassivation layer 638 (one embodiment of the repassivation layer 138) encapsulating the metal skeleton structure 610, whereas for the IC package 708, the package bump 124 is formed subsequent to formation of the repassivation layer 738 (one embodiment of the repassivation layer 138) encapsulating the metal skeleton structure 710.

Figure 8:
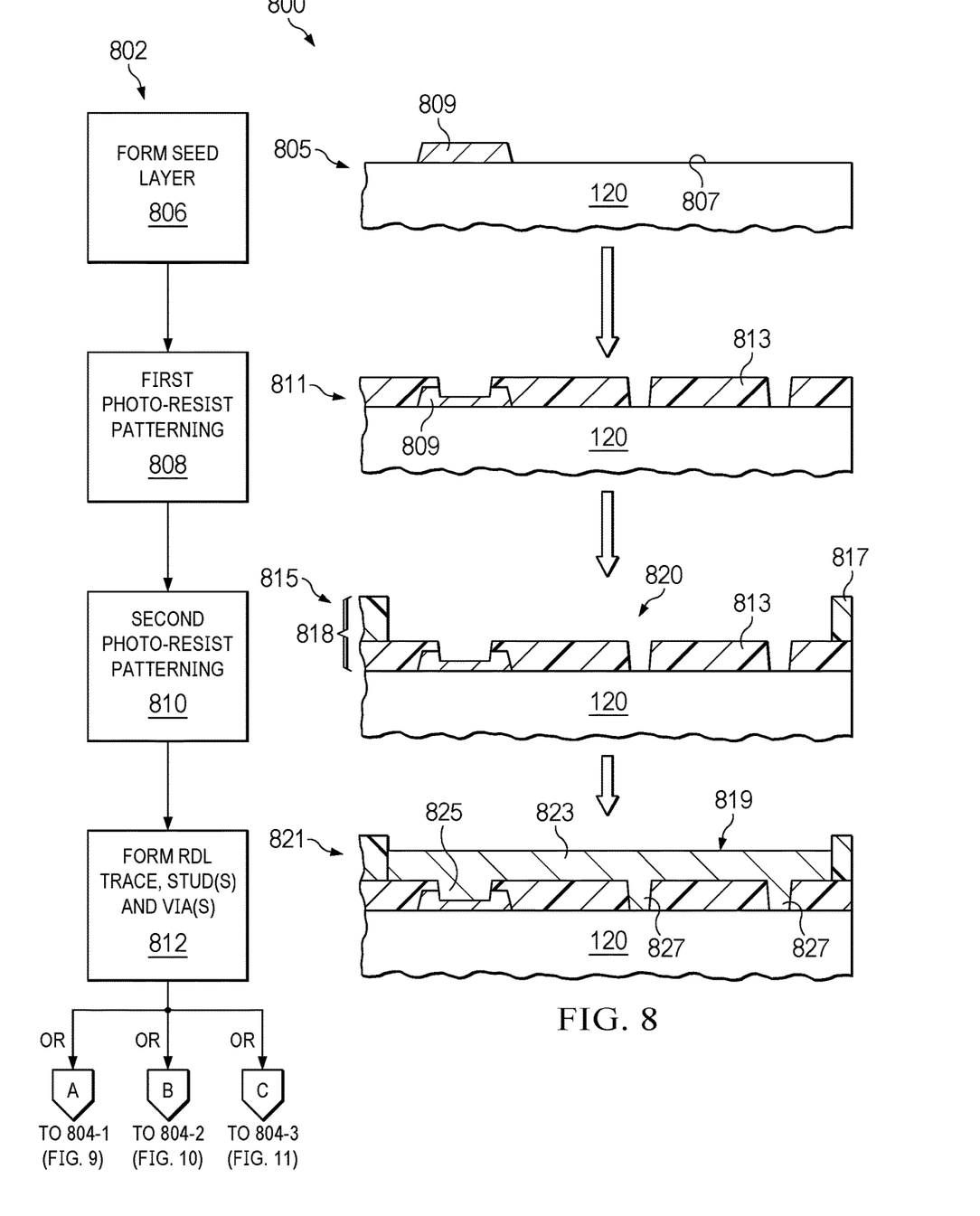
FIG. 8 is a flow diagram illustrating an initial stage of a method for fabricating an IC package utilizing a metallization-first stud-supported metal skeleton structure for package bumping in accordance with some embodiments.

FIGS. 8-11 illustrate variations of a fabrication process 800 for bump formation of an IC package using a UBM-free metallization-first skeleton metal structure in accordance with some embodiments. The fabrication process 800 includes a first stage 802 representing the metallization process for forming the skeleton metal structure, followed by a second stage 804 representing the processes of forming the package bump on the metal skeleton structure and encapsulating the metal skeleton structure. As illustrated by the partial cross-section views 104, 600, and 700 of FIGS. 1, 6, and 7, respectively, an IC package can be formed with a metal skeleton structure having an under-bump cavity (e.g., IC package 108 of FIG. 1), with a metal skeleton structure without an under-bump cavity and with the package bump formed after repassivation (IC package 608 of FIG. 6), or with a metal skeleton structure without an under-bump cavity and with the package bump formed prior to repassivation (IC package 708 of FIG. 7), among other ways. The first stage 802 of fabrication is the same for these three configurations is the same, but the second stage 804 differs for each of the three configurations. Accordingly, FIG. 8 illustrates the first stage 802 common to fabrication of each of the three example configurations, while FIGS. 9, 10, and 11 each illustrates a corresponding implementation of the second stage 804 of the fabrication process 800 for the configurations of the corresponding IC packages of FIGS. 1, 6, and 7, respectively.

As noted above, the first stage 802 results in the formation of a metal skeleton structure (e.g., metal skeleton structure) that serves the electrical path between at least one device contact pad 126 of an underlying microelectronic device and at least one package bump 124. Accordingly, the first stage 802 represents the start of the fabrication process 800 with a workpiece 805 composed of a microelectronic device 120 (e.g., an IC die). For purposes of the following, an implementation in which a top surface 807 of the microelectronic device 120 serves as the supporting surface for the support studs of the resulting metal skeleton structure is illustrated and described for each of the three example configuration variations, but it will be appreciated that the top surface of an adjacent component, such as an adjacent die or an adjacent layer of molding compound, may serve as the supporting surface.

As is known in the art, formation of a seed layer facilitates void-free interconnection for electroplating. Accordingly, at block 806, a sputtering process or other PVD process is performed on the workpiece 805 to form, for each device contact pad 126 (FIG. 1) of a microelectronic device 120 to be connected via the metal skeleton structure to be formed, a seed layer 809 (e.g., seed layer 134, FIG. 1) of one or more metals (e.g., copper or nickel (Ni)) overlying the device contact pad 126 (see FIG. 1). At block 808, a first photo-resist patterning process is performed to deposit a photo-resist layer overlying the relevant portion of the top surface 807 and the seed layer(s) 809 and then patterning the photo-resist layer in preparation for formation of the one or more vias (e.g., via 132, FIG. 1) and the one or more support studs (e.g., support studs 136, FIG. 1) of the metal skeleton structure to be formed. Any of a variety of well-known or proprietary photo-resist deposition and etch processes may be employed, such as any of a variety of photolithography processes, as may any of a variety of well-known or proprietary photo-resist materials. As shown, the patterning of the first photo-resist layer results in a workpiece 811 with a patterned photo-resist layer 813 having cavities or other apertures extending down to the seed layer(s) 809 for formation of corresponding vias) and cavities or other apertures extending down to the top surface 807 (for formation of the support studs). At block 810, the workpiece 811 is subjected to a second photo-resist patterning process to deposit a second photo-resist layer overlying the patterned photo-resist layer 813 and then patterning the second photo-resist layer to provide the lateral sidewall boundaries for an RDL trace (e.g., RDL trace 130, FIG. 1) to be formed for the metal skeleton structure being fabricated. The resulting patterned photo-resist layer 817 serves as a mask to define the lateral boundaries (that is, the sides or sidewalls) of the RDL trace of the metal skeleton structure to be formed, and results in a workpiece 815 having a stack 818 of patterned photo-resist layers (the patterned photo-resist layers 813 and 817 817), which together serve as a mask 820 for formation of a metal skeleton structure.

Accordingly, at block 812 a metallization process is performed on the workpiece 815 using the mask 820 to form a metal skeleton structure 819 (e.g., the metal skeleton structure 110, 610, or 710) in the resulting workpiece 821. As illustrated, the resulting metal skeleton structure 819 has an RDL trace 823 (e.g., RDL trace 130, FIG. 1), one or more vias 825 (e.g., via 132, FIG. 1) electrically and mechanically coupled to the one or more seed layers 809, and one or more support studs 827 (e.g., support studs 136, FIG. 1) positioned and dimensioned according to the dimensions of the corresponding openings formed in the patterned photo-resist layers 813 and 817, and which extend from the RDL trace to the top surface 807 of the microelectronic device 120. Any of a variety or combination of metallization processes may be performed to form the metal skeleton structure 819 in the mask provided by the combination of the patterned photo-resist layers 813 and 817, such as an electroplating process, a PVD process, or a chemical vapor deposition (CVD) process.

Figure 9:
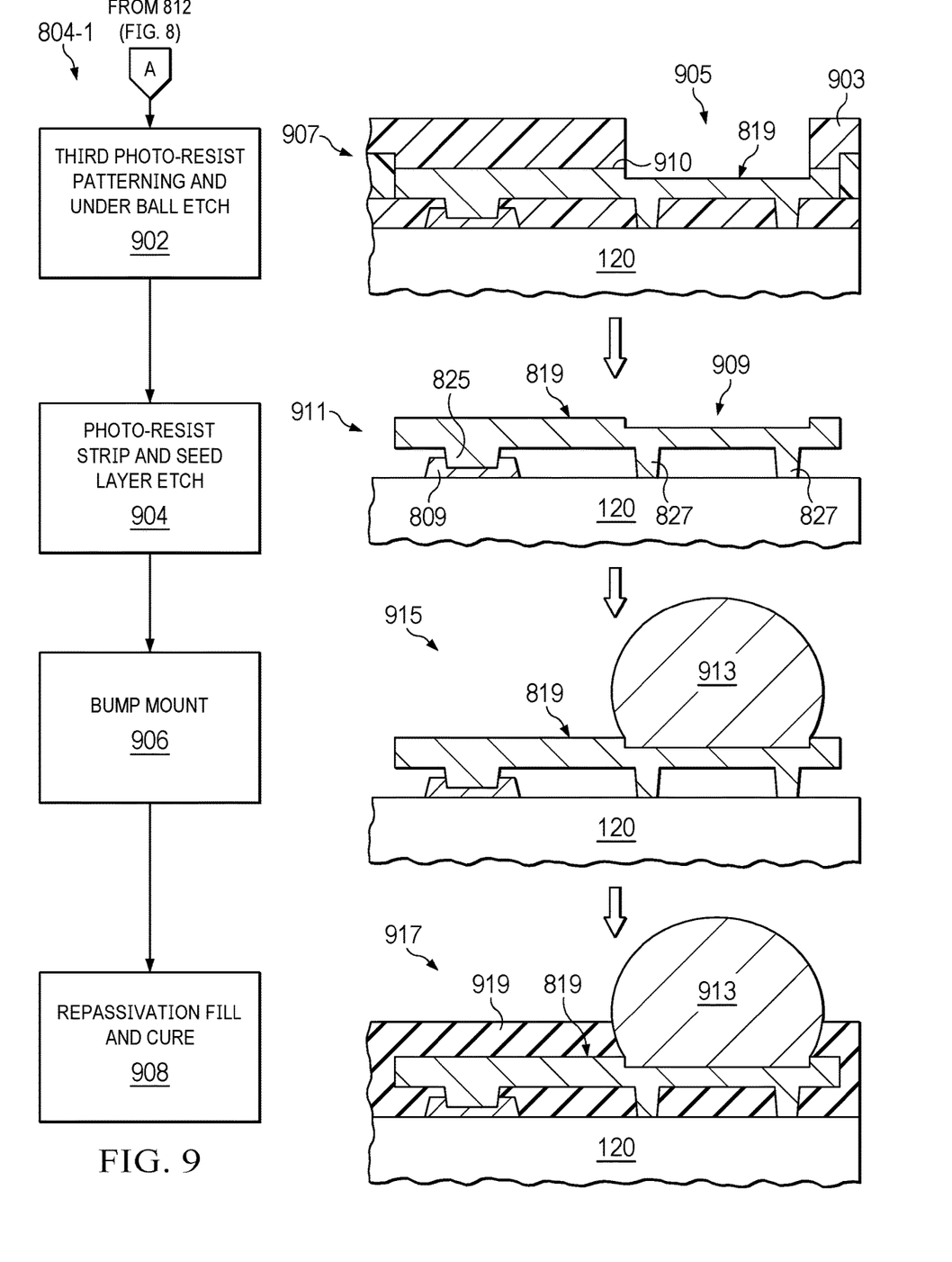
FIG. 9 is a flow diagram illustrating a second stage of the method of FIG. 8 for fabricating the IC package to utilize a metal skeleton structure having an under-bump cavity in accordance with some embodiments.

With the metallization process for at least initial formation of the metal skeleton structure 819 completed, the first stage 802 of the IC package fabrication process 800 is complete, and the IC package fabrication process 800 shifts to the second stage 804 for formation of the one or more package bumps and repassivation of the metal skeleton structure. As noted above, for the three example configurations of FIGS. 1, 6, and 7, implementation of this second stage 804 may differ. FIG. 9 illustrates an implementation of this second stage 804, referred to herein as second stage 804-1, for fabrication of an IC package having the metal skeleton structure 110 with under-bump cavity(ies) as shown in FIG. 1. Accordingly, the second stage 804-1 initiates at block 902 with a third photo-resist layer process in which a third photo-resist layer 903 is formed overlying the metal skeleton structure 819 and then patterned to create one or more apertures 905 that exposes a top surface 910 of the metal skeleton structure 819 and which is positioned and dimensioned for formation of one or more corresponding under-bump cavities (e.g., under-bump cavity 150, FIGS. 1 and 2). An etching process, such as a wet each process, is then performed on the resulting workpiece 907 to etch one or more under-bump cavities 909 into the top surface 910 of the metal skeleton structure 819, with the aperture 905 serving to guide the etch process.

At block 906, the workpiece 907 is subjected to a photo-resist strip process (e.g., application of solvent) to strip the photo-resist material of the three patterned photo-resist layers 813, 817, and 903, resulting in a workpiece 911 having the metal skeleton structure 819 extending up from the top surface 807 of the microelectronic device 120. As illustrated, as a result of the photo-resist strip process, at this point in the fabrication process the metal skeleton structure 819 extends up from the facing surface of the microelectronic device 120 without support of underlying material disposed between the microelectronic device 120 and the metal skeleton structure 819. Thus, in the absence of the support studs 827, the metal skeleton structure 819 would lack mechanical support away from the via 825 with the removal of the underlying photo-resist material of the patterned photo-resist layer 813 due to the photo-resist strip process of block 904. This lack of support would lead to a cantilevered configuration with excessive torque applied to the junction of the via 825 and the seed layer 809, likely resulting in failure of this junction. However, with the support studs 827 extending to the top surface 807 (as supporting surface), adequate support is provided for the bump capture portion (that is, the distal portion) of the metal skeleton structure 819 even with the removal of the underlying photo-resist material. Further, in some embodiments, a seed layer etch process is performed to isolate the seed layer 809.

With the bump capture portion of the metal skeleton structure 819 supported by the support studs 827, at block 906 a bump mount process is performed to mount a package bump 913 (e.g., package bump 124, FIG. 1) on the metal skeleton structure 819 at the bump capture portion of the RDL trace 823 and aligned with the under-bump cavity 909, resulting in a workpiece 915. In the illustrated example, the package bump 913 is a solder ball bump, and thus may be formed by positioning a solder ball in the under-bump cavity 909 and then performing a solder reflow to form the solder-based package bump 913. In other embodiments, the package bump 913 may be a metal pillar (e.g., a copper pillar) or other suitable type of package bump, and thus the appropriate bumping process may be employed to form the package bump 913 at the metal skeleton structure 819 and aligned with the under-bump cavity 909.

At block 908, a repassivation fill and cure process is performed on the workpiece 915 to form a resulting workpiece 917. This process includes encapsulating the metal skeleton structure 819 (and portion of the package bump 913 proximate to the metal skeleton structure 819) in one or more repassivation layers 919 composed of one or more dielectric polymers, molding compound, etc. Depending on the repassivation material, a curing process may need to be performed to cure the repassivation material. As illustrated, the repassivation material may be selected on the basis of its ability to fill the gaps formed between the metal skeleton structure 819 and the microelectronic device 120 as a result of the photo-resist strip process performed at block 904. Further wafer-level or panel-level processing may be performed as needed, and then the workpiece 917 singulated or otherwise separated from the corresponding fabrication carrier to result in a fabricated IC package.

Figure 10:
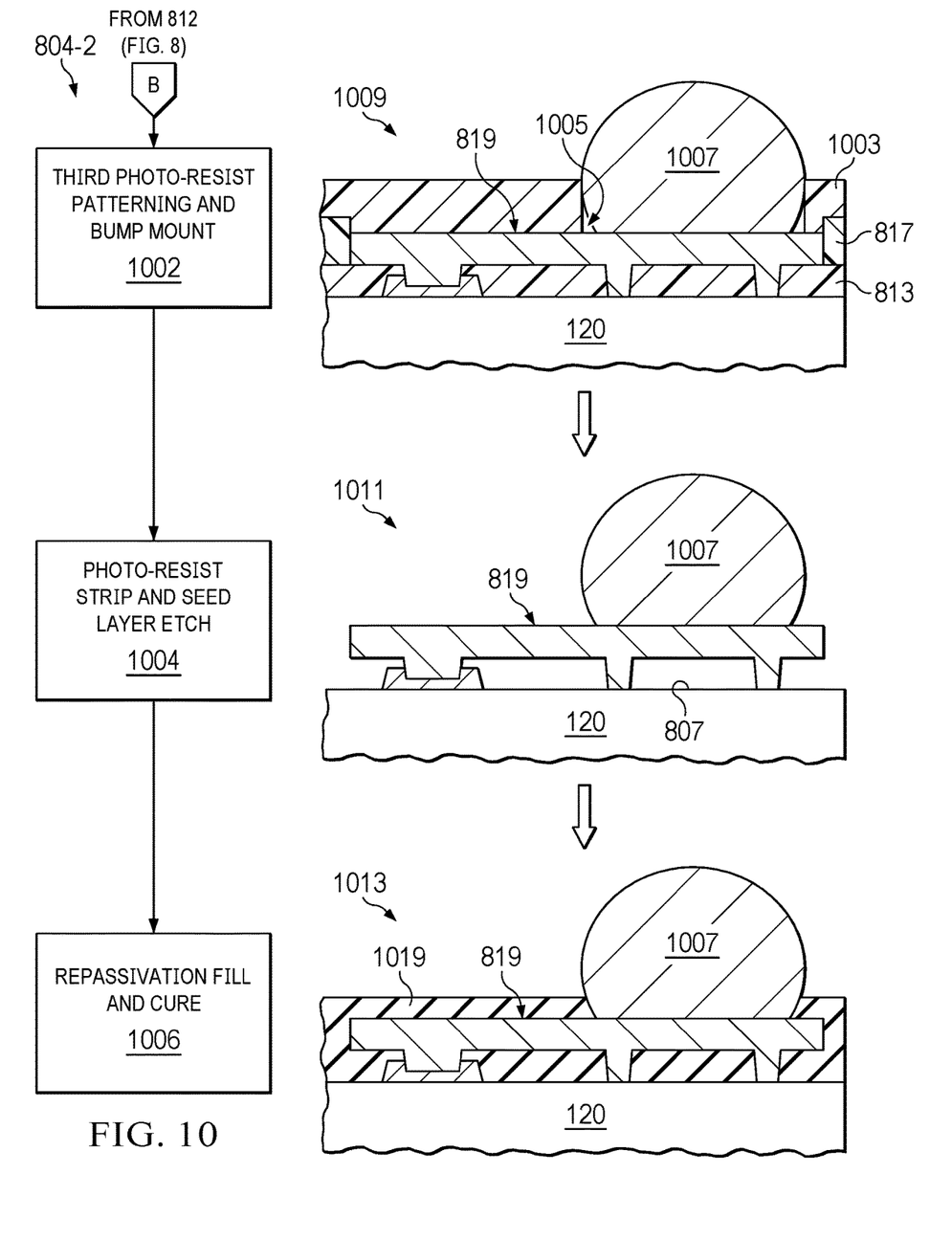
FIG. 10 is a flow diagram illustrating a second stage of the method of FIG. 8 for fabricating the IC package to utilize a metal skeleton structure without an under-bump cavity and with a bump mounting process preceding a photo-resist strip process in accordance with some embodiments.

FIG. 10 illustrates an implementation of the second stage 804, referred to herein as second stage 804-2, for fabrication of an IC package having the metal skeleton structure 610 without under-bump cavity(ies) as shown in FIG. 6. Accordingly, the second stage 804-2 initiates at block 1002 with a third photo-resist layer process in which a third photo-resist layer 1003 is formed overlying the metal skeleton structure 819 of the workpiece 821 (FIG. 8) and then patterned to create one or more apertures 1005, each exposing the top surface of the metal skeleton structure 819 and positioned and dimensioned for formation of a corresponding package bump. Thereafter, a package bump 1007 (e.g., package bump 124, FIG. 6) is formed or otherwise disposed in each aperture 1005 formed in the patterned photo-resist layer 1003, resulting in workpiece 1009. As explained above, this package bump can include a solder bump, a copper pillar or other metal pillar, and the like.

At block 1004, the workpiece 1009 is subjected to a photo-resist strip process to strip the photo-resist material of the three patterned photo-resist layers 813, 817, and 1003, resulting in a workpiece 1011 having the metal skeleton structure 819 extending up from the top surface 807 of the microelectronic device 120 and using the support studs 827 to provide mechanical support for the bump capture portion of the metal skeleton structure 819 underlying the one or more package bumps 1007 formed thereon. Further, in some embodiments, a seed layer etch process is also performed.

At block 1006, a repassivation fill and cure process is performed on the workpiece 1011 to form a resulting workpiece 1013. This process includes encapsulating the metal skeleton structure 819 (and portion of the package bump 1007 proximate to the metal skeleton structure 819) in one or more repassivation layers 1019 and, in some embodiments, performing a curing process to cure the repassivation material of the repassivation layers 1019. Further wafer-level or panel-level processing may be performed as needed, and then the workpiece 1013 singulated or otherwise separated from the corresponding fabrication carrier to result in an IC package.

Figure 11:
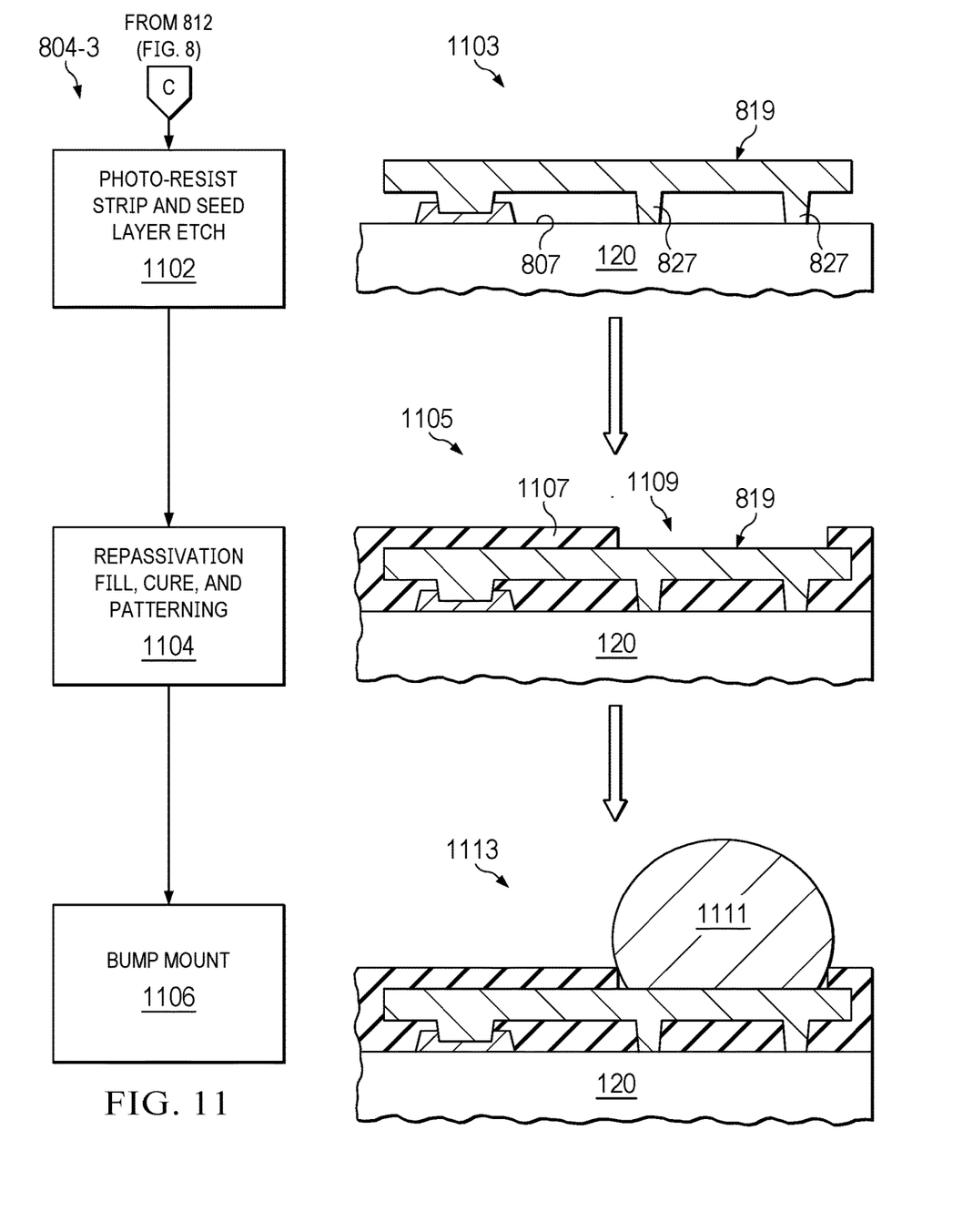
FIG. 11 is a flow diagram illustrating a second stage of the method of FIG. 8 for fabricating the IC package to utilize a metal skeleton structure without an under-bump cavity and with a repassivation filling process preceding a bump mounting process in accordance with some embodiments.

FIG. 11 illustrates another implementation of the second stage 804, referred to herein as second stage 804-3, for fabrication of an IC package having the metal skeleton structure 710 without under-bump cavity(ies) as shown in FIG. 7. The second stage 804-3 differs from the second stage 804-2 in that, for second stage 804-3, the package bump mount process is performed after the photo-resist strip and repassivation processes, whereas for second stage 804-2 of FIG. 10, the package bump mount process is performed prior to photo-resist strip and repassivation. Accordingly, the second stage 804-3 initiates at block 1102 with performing a photo-resist strip process on the workpiece 821 (FIG. 8) to strip the photo-resist material of the two patterned photo-resist layers 813 and 817, resulting in a workpiece 1103 having the metal skeleton structure 819 extending up from the top surface 807 of the microelectronic device 120 and using the support studs 827 to provide mechanical support for the bump capture portion of the metal skeleton structure 819 underlying the one or more package bumps to be formed thereon. Further, in some embodiments, a seed layer etch process is performed for seed layer isolation.

At block 1104, a repassivation fill, cure, and patterning process is performed on the workpiece 1103 to form a resulting workpiece 1105. This process includes encapsulating the metal skeleton structure 819 in one or more repassivation layers 1107 and, in some embodiments, performing a curing process to cure the repassivation material of the repassivation layers 1107. Thereafter, an aperture 1109 is formed in the one or more repassivation layers 1107 for each package bump to be formed on the metal skeleton structure 819, with each aperture 1109 exposing a top surface of the metal skeleton structure 819 and aligned with the intended position and dimension of the corresponding package bump to be formed.

At block 1106, a package bump mount process is performed on the workpiece 1105 to mount a package bump 1111 (e.g., package bump 124, FIG. 7) in each aperture 1109 formed in the one or more repassivation layers 1107, resulting in workpiece 1113. For example, if the package bump 1111 is a solder bump, a solder ball may be positioned in the aperture and placed into contact with the facing surface of the metal skeleton structure 819 and then a reflow process can be performed to reflow the solder ball into a solder bump mechanically and electrically connected to the metal skeleton structure 819. A similar process may be performed for forming the package bump 1111 as a metal pillar, or other bump structure. Further wafer-level or panel-level processing may be performed as needed, and then the workpiece 1113 singulated or otherwise separated from the corresponding fabrication carrier to result in an IC package.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An integrated circuit (IC) package comprising:
   one or more microelectronic devices disposed between a first side and an opposing second side of the IC package;
   a plurality of package bumps disposed at the first side of the IC package; and
   a metal structure electrically connecting at least a first device contact pad of a first microelectronic device and at least a first package bump of the plurality of package bumps, the metal structure comprising:
      a redistribution layer (RDL) trace extending parallel to the first side between a first region and a second region, the first region aligned with the first device contact pad and the second region aligned with the first package bump, wherein the first package bump is mechanically and electrically connected directly to the second region of the RDL trace;
      a first via extending between, and electrically coupled to, the first region of the RDL trace and the first device contact pad; and
      a set of one or more support studs extending from the second region of the RDL trace to a support surface parallel to a surface of the first microelectronic device facing the first side, the set of one or more support studs to provide mechanical support without providing an electrical connection.

2. The IC package of claim 1, further comprising at least one repassivation layer encapsulating the metal structure.

3. The IC package of claim 2, wherein the at least one repassivation layer encapsulates a portion of the first package bump adjacent to the second region of the RDL trace.

4. The IC package of claim 1, wherein the RDL trace comprises an under-bump cavity in which the first package bump is at least partially disposed.

5. The IC package of claim 1, further comprising a seed layer electrically and mechanically connecting the first via to the first device contact pad.

6. The IC package of claim 1, wherein the first region of the RDL trace is further aligned with a second device contact pad of the first microelectronic device and includes a second via extending between, and electrically coupled to, the first region of RDL trace and the second device contact pad.

7. The IC package of claim 6, wherein the second region of the RDL trace is further aligned with a second package bump and wherein the second package bump is mechanically and electrically connected directly to the second region of the RDL trace.

8. The IC package of claim 1, wherein the second region of the RDL trace is further aligned with a second package bump and wherein the second package bump is mechanically and electrically connected directly to the second region of the RDL trace.

9. The IC package of claim 1, wherein the supporting surface is one of: the surface of the first microelectronic device; a surface of a second microelectronic device adjacent to the first microelectronic device; or a surface of a layer of dielectric material formed adjacent to the first microelectronic device.

10. The IC package of claim 1, wherein:
the first package bump is one of a solder bump or a metal pillar; and
the first microelectronic device is one of an integrated circuit die or a surface mount IC device.

11. The IC package of claim 1, wherein the set of support studs is composed of a metal selected from a group consisting of copper and a copper alloy.

12. An integrated circuit (IC) package comprising:
one or more microelectronic devices disposed between a first side and an opposing second side of the IC package;
a plurality of package bumps disposed at the first side of the IC package; and
a metal structure electrically connecting at least a first device contact pad of a first microelectronic device and at least a first package bump of the plurality of package bumps, the metal structure comprising:
a redistribution layer (RDL) trace having a first region and a second region, the second region is coupled to the first package bump electrically and mechanically;
a first via extending between, and electrically coupled to, the first region of the RDL trace and the first device contact pad; and
a set of one or more support studs extending between the second region of the RDL trace and a support surface that extends parallel to a surface of the first microelectronic device that faces the first side, the set of one or more support studs to provide mechanical support without providing an electrical connection to the support surface.

13. The IC package of claim 12, further comprising at least one repassivation layer encapsulating the metal structure and a portion of the first package bump adjacent to the second region of the RDL trace.

14. The IC package of claim 12, wherein the RDL trace comprises an under-bump cavity in which the first package bump is at least partially disposed.

15. The IC package of claim 12, further comprising a seed layer electrically and mechanically connecting the first via to the first device contact pad.

16. The IC package of claim 12, wherein:
the first region of the RDL trace is further aligned with a second device contact pad of the first microelectronic device and includes a second via extending between, and electrically coupled to, the first region of RDL trace and the second device contact pad; and
the second region of the RDL trace is further aligned with a second package bump and wherein the second package bump is mechanically and electrically connected directly to the second region of the RDL trace.

17. The IC package of claim 12, wherein the second region of the RDL trace is further aligned with a second package bump and wherein the second package bump is mechanically and electrically connected directly to the second region of the RDL trace.

18. The IC package of claim 12, wherein the supporting surface is one of: the surface of the first microelectronic device; a surface of a second microelectronic device adjacent to the first microelectronic device; or a surface of a layer of dielectric material formed adjacent to the first microelectronic device.

19. The IC package of claim 12, wherein:
the first package bump is one of a solder bump or a metal pillar; and
the first microelectronic device is one of an integrated circuit die or a surface mount IC device.

20. The IC package of claim 12, wherein the set of support studs is composed of a metal selected from a group consisting of copper and a copper alloy.

* * * * *